(12) United States Patent
Miyamoto

(10) Patent No.: US 11,066,746 B1
(45) Date of Patent: Jul. 20, 2021

(54) LIQUID MATERIAL VAPORIZATION AND SUPPLY DEVICE, AND CONTROL PROGRAM

(71) Applicant: HORIBA STEC, Co., Ltd., Kyoto (JP)

(72) Inventor: Hideaki Miyamoto, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 195 days.

(21) Appl. No.: 16/491,466

(22) PCT Filed: Apr. 13, 2018

(86) PCT No.: PCT/JP2018/015588
§ 371 (c)(1),
(2) Date: Sep. 5, 2019

(87) PCT Pub. No.: WO2018/207553
PCT Pub. Date: Nov. 15, 2018

(30) Foreign Application Priority Data

May 11, 2017 (JP) .............................. JP2017-094775

(51) Int. Cl.
*G05D 11/00* (2006.01)
*C23C 16/448* (2006.01)
(Continued)

(52) U.S. Cl.
CPC ............. *C23C 16/4485* (2013.01); *B01J 7/02* (2013.01); *G05B 15/02* (2013.01); *G05D 7/0635* (2013.01);
(Continued)

(58) Field of Classification Search
CPC ..... G05D 7/0635; C23C 16/4485; C02F 1/50; H01M 8/0662; B01F 3/026; G05B 15/02
See application file for complete search history.

(56) References Cited

U.S. PATENT DOCUMENTS 6,039,809 A * 3/2000 Toyama .................. B01F 3/026
118/715
6,821,481 B1 * 11/2004 Osajima .................... C02F 1/50
210/764
(Continued)

FOREIGN PATENT DOCUMENTS

JP         S54162295 A     12/1979
JP         S60244332 A     12/1985
(Continued)

OTHER PUBLICATIONS

ISA Japan Patent Office, International Search Report Issued in International Application No. PCT/JP2018/015588, dated Jun. 26, 2018, WIPO, 3 pages.

*Primary Examiner* — Tuan A Vu
(74) *Attorney, Agent, or Firm* — Alleman Hall Creasman & Tuttle LLP

(57) ABSTRACT

A liquid material vaporization and supply device is provided in which it is possible to accurately control a flow rate even in the case where calibration data is not available for a material gas. A first tank in which a liquid material is vaporized to produce material gas; a second tank in which the material gas is contained at a predetermined pressure; a pressure sensor that senses the pressure inside the second tank; a lead-out path for leading the material gas out of the second tank; a fluid control valve that is provided to open/close the lead-out path; and a flow rate control part that, when the material gas is led out through the lead-out path, on the basis of a reduction in the pressure sensed by the pressure sensor, controls the opening level of the valve to control the flow rate of the material gas are included.

15 Claims, 3 Drawing Sheets

(51) Int. Cl.
  *B01J 7/02* (2006.01)
  *G05D 7/06* (2006.01)
  *G05B 15/02* (2006.01)
  *H01M 8/0662* (2016.01)
  *B01F 3/02* (2006.01)
  *C02F 1/50* (2006.01)

(52) U.S. Cl.
  CPC ............... *B01F 3/026* (2013.01); *C02F 1/50* (2013.01); *H01M 8/0662* (2013.01)

(56) References Cited

U.S. PATENT DOCUMENTS

2006/0228611 A1* 10/2006 Nakata ................ H01M 8/0662
  429/423
2014/0356796 A1* 12/2014 Terasaka ............. C23C 16/4485
  432/13

FOREIGN PATENT DOCUMENTS

| JP | H03141192 A | 6/1991 |
| JP | 2014236018 A | 12/2014 |

* cited by examiner

LIQUID MATERIAL VAPORIZATION AND SUPPLY DEVICE, AND CONTROL PROGRAM

TECHNICAL FIELD

The present invention relates to a liquid material vaporization and supply device, and to a control program.

BACKGROUND ART

As a liquid material vaporization and supply device used in a semiconductor manufacturing process, as disclosed in Patent Literature 1, there is one including: a vaporization tank in which a liquid material is vaporized to produce material gas; a pressure sensor that senses the pressure inside the vaporization tank; a lead-out path for leading the material gas out of the vaporization tank; and a flow rate controller (a so-called mass flow controller) that is provided in the lead-out path to control the flow rate of the material gas flowing through the lead-out path.

However, in the conventional liquid material vaporization and supply device disclosed in Patent Literature 1 above, since the sensitivity of a flow rate sensor incorporated in the flow rate controller is different depending on the type of the material gas, calibration has to be performed corresponding to the type of the material gas, and for this reason, there has been a problem of being unable to accurately control the flow rate of material gas on which calibration data is not available.

CITATION LIST

Patent Literature

Patent Literature 1
Japanese Unexamined Patent Publication JP-A2014-236018

SUMMARY OF INVENTION

Technical Problem

Therefore, the main object of the present invention is to eliminate the need to perform calibration corresponding to the type of material gas, and to make it possible to accurately control a flow rate even in the case of material gas on which calibration data is not available.

Solution to Problem

That is, the liquid material vaporization and supply device according to the present invention includes: a first tank in which a liquid material is vaporized to produce material gas; a second tank that is connected to the first tank and in which the material gas produced in the first tank is contained at a predetermined pressure; a pressure sensor that senses the pressure inside the second tank; a lead-out path for leading the material gas out of the second tank; a fluid control valve that is provided in the lead-out path to open/close the lead-out path; and a flow rate control part that, when the material gas contained in the second tank at the predetermined pressure is led out through the lead-out path, on the basis of a reduction in the sensed pressure sensed by the pressure sensor, controls the opening level of the fluid control valve to control the flow rate of the material gas led out through the lead-out path.

According to the liquid material vaporization and supply device according to the present invention, since the flow rate of the material gas led out of the second tank is controlled on the basis of the reduction in the pressure inside the second tank sensed by the pressure sensor, the flow rate of the material gas can be accurately controlled regardless of the type of the material gas. This makes it possible to accurately control a flow rate even in the case of material gas on which calibration data is not available. Also, the flow rate controller used in the above-described conventional liquid material vaporization and supply device is low in heat resistance, so that the upper limit of heating temperature for the vaporization tank corresponding to the first tank in the present invention has to be set low, and along with this, the upper limit of the vapor pressure inside the vaporization tank is low, causing the problem that the maximum flow rate of the material gas is limited; however, according to the liquid material vaporization and supply device according to the present invention, the flow rate of the material gas can be controlled by the pressure sensor and the fluid control valve that are high in heat resistance, so that the upper limit of heating temperature for vaporizing the liquid material can be set high, and along with this, the vapor pressure of the material gas contained from the first tank to the second tank is high, thus making it possible to increase the maximum flow rate of the material gas. Further, as a problem specific to the flow rate controller used in the above-described conventional liquid material vaporization and supply device, there has been a problem of slow response speed; however, according to the liquid material vaporization and supply device of the present invention, since the opening level of the fluid control valve can be controlled on the basis of the sensed pressure sensed by the pressure sensor, response speed is sped up.

Also, the flow rate control part of the liquid material vaporization and supply device may be one including: a flow rate calculation part that, on the basis of the reduction amount of the sensed pressure sensed by the pressure sensor per unit time, calculates the flow rate of the material gas led out of the second tank within the unit time; and a valve control part that, on the basis of the deviation between the calculated flow rate calculated in the flow rate calculation part and a preset set flow rate, controls the opening level of the fluid control valve.

In addition, the liquid material vaporization and supply device may further include a flow rate sensor that senses the flow rate of the material gas led out through the lead-out path, and the flow rate control part may be one including: a valve control part that, on the basis of the deviation between the sensed flow rate sensed by the flow rate sensor and a preset set flow rate, controls the opening level of the fluid control valve; a flow rate calculation part that, on the basis of the reduction amount of the sensed pressure sensed by the pressure sensor per unit time, calculates the flow rate of the material gas led out of the second tank within the unit time; and a set flow rate correction part that, on the basis of the deviation between the calculated flow rate calculated in the flow rate calculation part and the set flow rate, corrects the set flow rate.

In such a configuration, as with the conventional liquid material vaporization and supply device, the flow rate of the material gas is controlled on the basis of the sensed flow rate sensed by the flow rate sensor; however, the control is based on the set flow rate corrected with reference to a reduction in the sensed pressure sensed by the pressure sensor, thus making it possible to accurately control the flow rate of the material gas regardless of the type of the material gas. In addition, in this case, since the flow rate of the material gas led out through the lead-out path between timings at which the pressure sensor senses sensed pressures is controlled on the basis of the sensed flow rate, the influence of noise associated with disturbance and the like occurring between the timings can be suppressed. Also, when the set flow rate is not changed (a reference set flow rate preliminarily stored in a memory is not reset), by providing limits to the variation width of the corrected set flow rate, hypersensitive flow rate change when the noise or variation of the sensed pressure sensed by the pressure sensor is large can be suppressed. However, since the flow rate sensor is used, response speed is slowed down and heat resistance is lowered.

Also, any of the above-described flow rate control parts may be one further including a unit time changing part that, on the basis of the set flow rate, changes the unit time, and changes the unit time to be longer as the set flow rate is made smaller.

When the reduction amount of the pressure per unit time is small, it is easy to undergo the influence of the error of the sensed pressure sensed by the pressure sensor. For this reason, when changing the unit time to be longer as the set flow rate is made smaller as with the above-described flow rate control part, the reduction amount of the pressure per unit time is increased, making it possible to suppress the influence of the error of the sensed pressure sensed by the pressure sensor.

Also, the flow rate control part of the liquid material vaporization and supply device may be one including: a flow rate calculation part that, on the basis of the reduction amount between sensed pressure sensed by the pressure sensor at a predetermined timing and sensed pressure sensed after a predetermined time has elapsed since the predetermined timing, calculates the flow rate of the material gas led out of the second tank within the predetermined time; an assumed flow rate calculation part that assumes the case where the material gas is led out of the second tank in accordance with a preset set flow rate, and under this assumption, calculates the flow rate of the material gas led out within the predetermined time; and a valve control part that, on the basis of the deviation between the calculated flow rate calculated in the flow rate calculation part and the assumed flow rate calculated in the assumed flow rate calculation part, controls the opening level of the fluid control valve, and in this case, the flow rate calculation part may be one that, on the basis of the reduction amount of sensed pressure sensed per unit time by the pressure sensor every unit time since the predetermined timing, calculates the flow rate of the material gas led out of the second tank within each unit time, and on the basis of each resulting calculated flow rate, calculates the flow rate of the material gas led out of the second tank within the predetermined time.

In such a configuration, as the leading out of the material gas from the second tank progresses, an elapsed time from the predetermined timing is lengthened, and therefore the reduction amount of the pressure within the elapsed time is increased, making it possible to suppress the influence of the error of the pressure sensed by the pressure sensor.

Note that the calculated flow rate calculated in the flow rate calculation part is the average flow rate of the material gas led out through the lead-out path within a certain time (the unit time, the predetermined time); however, noise may occurs in sensing by the pressure sensor because of disturbance or the like, and in this case, it is not the average flow rate in a strict sense. Accordingly, it can also be said that the calculated flow rate is a substantially average flow rate.

Also, the flow rate control part of the liquid material vaporization and supply device may be one including: an assumed pressure calculation part that assumes the case where the material gas is led out of the second tank in accordance with a preset set flow rate, and under this assumption, calculates the assumed pressure inside the second tank after a predetermined time has elapsed since the material gas started to be led out; and a valve control part that, on the basis of the deviation between sensed pressure sensed by the pressure sensor after the predetermined time has elapsed since the material gas started to be led out of the second tank and the assumed pressure calculated in the assumed pressure calculation part, controls the opening level of the fluid control valve.

Further, any of the above-described liquid material vaporization and supply devices may be one further including a temperature sensor that senses the temperature inside the second tank, in which the flow rate control part further includes a sensed pressure correction part that, on the basis of the sensed temperature sensed by the temperature sensor, corrects the sensed pressure sensed by the pressure sensor. In this case, the sensed pressure correction part may be one that, on the basis of sensed temperature sensed by the temperature sensor when sensed pressure is sensed by the pressure sensor, corrects the sensed pressure, and the sensed pressure correction part may be one that, when the material gas is introduced from the first tank to the second tank, preliminarily acquires a temperature rise amount sensed by the temperature sensor during a period from the start of the introduction to when the temperature inside the second tank is stabilized after the end of the introduction, and on the basis of the temperature rise amount, corrects the sensed pressure sensed by the pressure sensor when leading the material gas out of the second tank.

As the leading out of the material gas from the second tank progresses, the pressure inside the second tank is reduced to expand the second tank. Along with this, the temperature inside the second tank is reduced, and this causes an error in the sensed pressure sensed by the pressure sensor. Accordingly, as described above, by correcting the sensed pressure sensed by the pressure sensor on the basis of the sensed temperature sensed by the temperature sensor in the sensed pressure correction part, the error of the sensed pressure sensed by the pressure sensor can be suppressed.

Also, any of the above-described liquid material vaporization and supply devices may be one further including a pressure control mechanism that controls the material gas introduced from the first tank to the second tank to a predetermined pressure.

When the pressure of the material gas contained in the second tank is increased, along with this, the sensed pressure sensed by the pressure sensor is also increased to easily cause an error. Accordingly, as described above, when the pressure control mechanism controls the pressure of the material gas contained in the second gas to keep the pressure of the material gas contained in the second tank low to some extent, an error can be suppressed because the sensed pressure sensed by the pressure sensor is also lowered.

In addition, as a specific example of the pressure control mechanism, the pressure control mechanism including: an on-off valve that adjusts the flow rate of the material gas introduced from the first tank to the second tank; and a pressure control part that opens/closes the on-off valve, and on the basis of the differential pressure between the first tank and the second tank, controls the pressure of the material gas introduced to the second tank can be cited. In this case, the pressure control part may be one that adjusts the temperature of a heater for heating the first tank, and controls the differential pressure between the first tank and the second tank.

Further, as a specific example of the pressure control mechanism, one including: a pump that forcibly introduces the material gas from the first tank to the second tank; and a pressure control part that stops driving of the pump, and controls the pressure of the material gas introduced to the second tank can also be cited. In such a configuration, the pressure of the material gas introduced to the second tank can be raised without raising the heating temperature for the liquid material, and this eliminates the need to expose the liquid material to high temperature for a long time and makes it possible to reduce a risk such as alteration/decomposition of the liquid material.

Also, in any of the above-described pressure control mechanisms, the pressure control part may be one that stops introducing the material gas to the second tank when the sensed pressure sensed by the pressure sensor reaches a predetermined pressure.

Even in such a configuration, the pressure of the material gas introduced to the second tank can be controlled to keep the pressure of the material gas introduced to the second tank low to some extent, and an error can be suppressed because the sensed pressure sensed by the pressure sensor is lowered.

Further, in any of the above-described liquid material vaporization and supply devices, multiple second tanks may be connected to the first tank, and an introduction tank number adjustment part that, on the basis of the set flow rate, adjusts the number of the second tanks to which the material gas is to be introduced may be further included.

In such a configuration, when the set flow rate is large, the number of the second tanks for containing the material gas is increased to enable the total amount of the material gas led out of the second tank to be ensured, whereas when the set flow rate is small, the number of the second tanks for containing the material gas is decreased to increase the reduction amount of the sensed pressure sensed by the pressure sensor, making it possible to suppress an error.

Also, the control program according to the present invention is a control program for a liquid material vaporization and supply device including: a pressure sensor that senses the pressure inside a second tank in which material gas is temporarily contained at a predetermined pressure from a first tank in which a liquid material is vaporized to produce the material gas; a fluid control valve that opens/closes a lead-out path for leading the material gas out of the second tank; and a flow rate control part that controls the opening level of the fluid control valve, and enables the flow rate control part to fulfill a function of, when the material gas contained in the second tank at the predetermined pressure is led out through the lead-out path, on the basis of a reduction in the sensed pressure sensed by the pressure sensor, controlling the opening level of the fluid control valve to control the flow rate of the material gas led out through the lead-out path.

Advantageous Effects of Invention

According to the present invention configured as described, the need to perform calibration corresponding to the type of material gas is eliminated, and even in the case of material gas on which calibration data is not available, a flow rate can be accurately controlled.

LIST OF REFERENCE CHARACTERS

Figure 1:
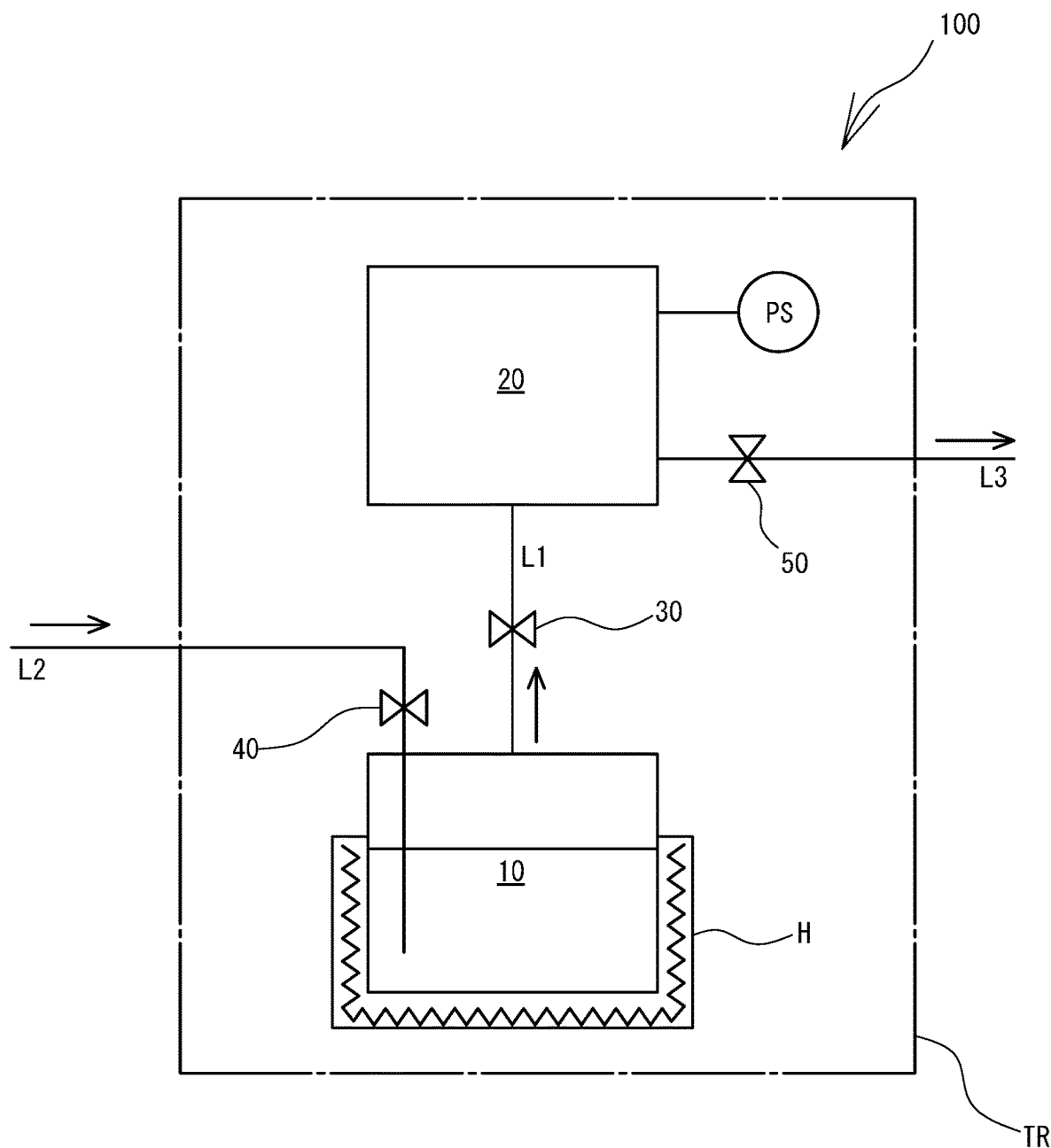
FIG. 1 is a schematic diagram illustrating a liquid material vaporization and supply device in a first embodiment.

100 Liquid material vaporization and supply device
10 First tank
20 Second tank
30 First on-off valve
40 Second on-off valve
50 Fluid control valve
L1 Connection path
L2 Introduction path
L3 Lead-out path
H Heater
PS Pressure sensor
FS Flow rate sensor

DESCRIPTION OF EMBODIMENTS

In the following, the liquid material vaporization and supply device according to the present invention will be described with reference to the drawings.

A liquid material vaporization and supply device according to the present embodiment is used to supply material gas to a chamber (a supply destination) at a stable flow rate in, for example, a semiconductor manufacturing process. Note that the liquid material vaporization and supply device can also be used in applications other than the semiconductor manufacturing process.

First Embodiment

As illustrated in FIG. 1, the liquid material vaporization and supply device 100 according to the present embodiment includes: a first tank 10 in which a liquid material is vaporized to produce material gas; a second tank 20 in which the material gas produced in the first tank 10 is temporarily contained at a predetermined pressure; a connection path L1 that connects between the first tank 10 and the second tank 20; an introduction path L2 for introducing the liquid material to the first tank 10; and a lead-out path L3 for leading the material gas out of the second tank 20. In addition, one end of the connection path L1 connected to the first tank 10 is connected to a gas phase space in the first tank 10. Also, the other end of the introduction path L2 on a side opposite to one end connecting to the first tank 10 is connected to an unillustrated liquid material supply device, and the other end of the lead-out path L3 on a side opposite to one end connected to the second tank 20 is connected to an unillustrated chamber.

Further, the connection path L1 is installed with a first on-off valve 30 for opening/closing the flow path thereof; the introduction path L2 is installed with a second on-off valve 40 for opening/closing the flow path thereof; and the lead-out path L3 is installed with a fluid control valve 50 for controlling the flow rate of the material gas led out of the second tank 20. Also, the second tank 20 is installed with a pressure sensor PS for sensing the pressure inside the second tank 20. In addition, the first on-off valve 30 corresponds to an on-off valve in claims. Further, the fluid control valve 50 only has to be one capable of controlling fluid, and in addition to one that controls a flow rate, one that controls pressure, and others are also included.

In addition, the respective members (first tank 10, second tank 20, respective valves 30, 40, 50, pressure sensor, and the like) other that the other end side of the introduction path L2 and the other end side of the lead-out path L3 are all contained in a thermostat region TR, and in doing so, the respective members are kept at a predetermined temperature (high temperature). This makes it possible to prevent reliquefaction of the liquid material to keep the amount of the material gas contained in the second tank 20 constant. Also, the first tank 10 is provided with a heater H for heating and vaporizing the liquid material.

The liquid material vaporization device 100 includes an unillustrated control device, and the control device is connected to the pressure sensor PS and the respective valves 30, 40, 50. In addition, the control device is constituted by a so-called computer including a CPU, a memory, A/D·D/A converters, input/output means, and the like, and adapted to implement functions thereof by executing a program stored in the memory to make various equipment cooperate. Specifically, functions as a flow rate control part that controls the flow rate of the material gas led out of the second tank 20 and a pressure control part that controls the pressure of the material gas introduced from the first tank 10 to the second tank 20 are fulfilled. In addition, a mechanism including the first on-off valve 30 and the pressure control part in the present embodiment corresponds to a pressure control mechanism in claims.

The flow rate control part includes: a flow rate calculation part that, on the basis of the reduction amount of sensed pressure sensed by the pressure sensor PS per unit time, calculates the flow rate of the material gas led out of the second tank 20 within the unit time; and a valve control part that, on the basis of the deviation between the calculated flow rate calculated in the flow rate calculation part and a preset set flow rate, controls the opening level of the fluid control valve 50 so that the calculated flow rate comes close to the set flow rate.

In addition, specifically, the flow rate calculation part first calculates the total amount $\Delta n$ of the material gas led out of the second tank 20 within the unit time $\Delta t$ from Expression (2) obtained by substituting the reduction amount $\Delta P$ of the sensed pressure sensed by the pressure sensor PS per unit time $\Delta t$ into Expression (1) that is the gas state equation.

$$PV = nRT \quad (1)$$

$$\Delta P = \Delta n \times (RT/V) \quad (2)$$

Here, P represents the pressure inside the second tank 20, V the volume of the second tank 20, n the physical quantity of the material gas contained in the second tank 20, R the molar gas constant of the material gas contained in the second tank 20, and T the temperature of the material gas in the second tank. Incidentally, the temperature inside the second tank 20 is kept constant.

Further, the calculated flow rate Q of the material gas led out of the second tank 20 within the unit time is calculated by Expression (3).

$$Q = A \times (\Delta P/\Delta t) \quad (3)$$

Here, A represents a coefficient, and has a value corrected on the basis of the type, temperature T, and pressure P of the material gas. In addition, the corrected value of A may be a value small enough to be ignored. Further, $\Delta t$ in the above respective expressions is not limited to the unit time, but may be an arbitrary time interval.

The pressure control part has a function of sequentially opening/closing the respective valves 30, 40, 50 to control the pressure of the material gas introduced from the first tank 10 to the second tank 20 on the basis of the differential pressure between the first tank 10 and the second tank 20. In addition, it also has a function of controlling the magnitude of the differential pressure between the first tank 10 and the second tank 20 by adjusting the heating temperature of the heater H provided to the first tank 10 to limit the rise value of the pressure inside the first tank 10.

Next, the operation of introducing the material gas from the first tank 10 to the second tank 20 in the present embodiment will be described.

First, when an introduction instruction signal is inputted from the input means to the pressure control part, the pressure control part closes the first on-off valve 30 and the second on-off valve 40 and opens the fluid control valve 50. Then, the pressure control part adjusts the heating temperature of the heater H provided to the first tank 10, vaporizes the liquid material in the first tank 10 to produce the material gas, and raises the pressure inside the first tank 10 to a predetermined vapor pressure. At this time, the second tank 20 is depressurized to a substantially vacuum state in parallel by a vacuum pump (not illustrated) provided on the downstream side of the lead-out path L3. Subsequently, the pressure control part closes the fluid control valve 50, and opens the first on-off valve 30 while keeping the inside of the second tank 20 in the substantially vacuum state. In doing so, the material gas resulting from the vaporization in the first tank 10 is introduced into the second tank 20 by the differential pressure between the first tank 10 and the second tank 20 until the pressure inside the second tank 20 reaches the predetermined vapor pressure. Finally, the pressure control part closes the first on-off valve 30 to complete the introduction operation. This allows the material gas to be in a state of being contained in the second tank 20 at the predetermined pressure (predetermined vapor pressure).

In addition, when vaporizing the liquid material in the first tank 10, whether or not the pressure (vapor pressure inside the first tank 10 rises to the predetermined value only has to be determined by preliminarily acquiring vaporization data in which a relationship of a pressure rise associated with a heating time for the first tank 10 is related to each heating temperature of the heater H, and storing the vaporization data in the memory to refer to the vaporization data. Alternatively, the determination may be made by separately providing a pressure sensor for sensing the pressure inside the first tank 10 and actually measuring the pressure inside the first tank 10 by the pressure sensor.

Next, the operation of supplying the material gas from the second tank 20 to the supply destination will be described.

First, when a supply instruction signal is inputted from the input means to the flow rate control part, the flow rate control part opens the fluid control valve 50 to a preset initial opening level. This allows the material gas to start flowing out from the second tank 20 to the lead-out path L3. Then, the flow rate calculation part senses the pressure inside the second tank 20 by the pressure sensor PS to acquire the pressure reduction amount $\Delta Pt$ per unit time $\Delta t$, and substitutes it into Expression (3) above to calculate the calculated flow rate $Q_C$ of the material gas led out of the second tank 20 within the unit time $\Delta t$. Subsequently, the valve control part controls the opening level of the fluid control valve 50 so that the calculated flow rate $Q_C$ calculated in the flow rate calculation part comes close to the preset set flow rate $Q_S$. Then, the flow rate calculation part repeats calculating the calculated flow rate every unit time and on the basis of the resulting calculation result, the valve control part repeats controlling the opening level of the fluid control valve 50, whereby the material gas from the second tank 20 is controlled at a flow rate near the set flow rate $Q_S$.

In addition, in such a configuration, after supplying the material gas of an amount corresponding to the volume of the second tank 20 to the supply destination, the material gas has to be introduced to the second tank 20 again, and it is not impossible to continuously keep supplying the material gas to the supply destination; however, in recent years, as one of deposition techniques in a semiconductor control process, a technique called ALD (Atomic Layer Deposition) that supplies material gas in a pulsating manner has been established, and utilization for this deposition technique is very effective.

Second Embodiment

Figure 2:
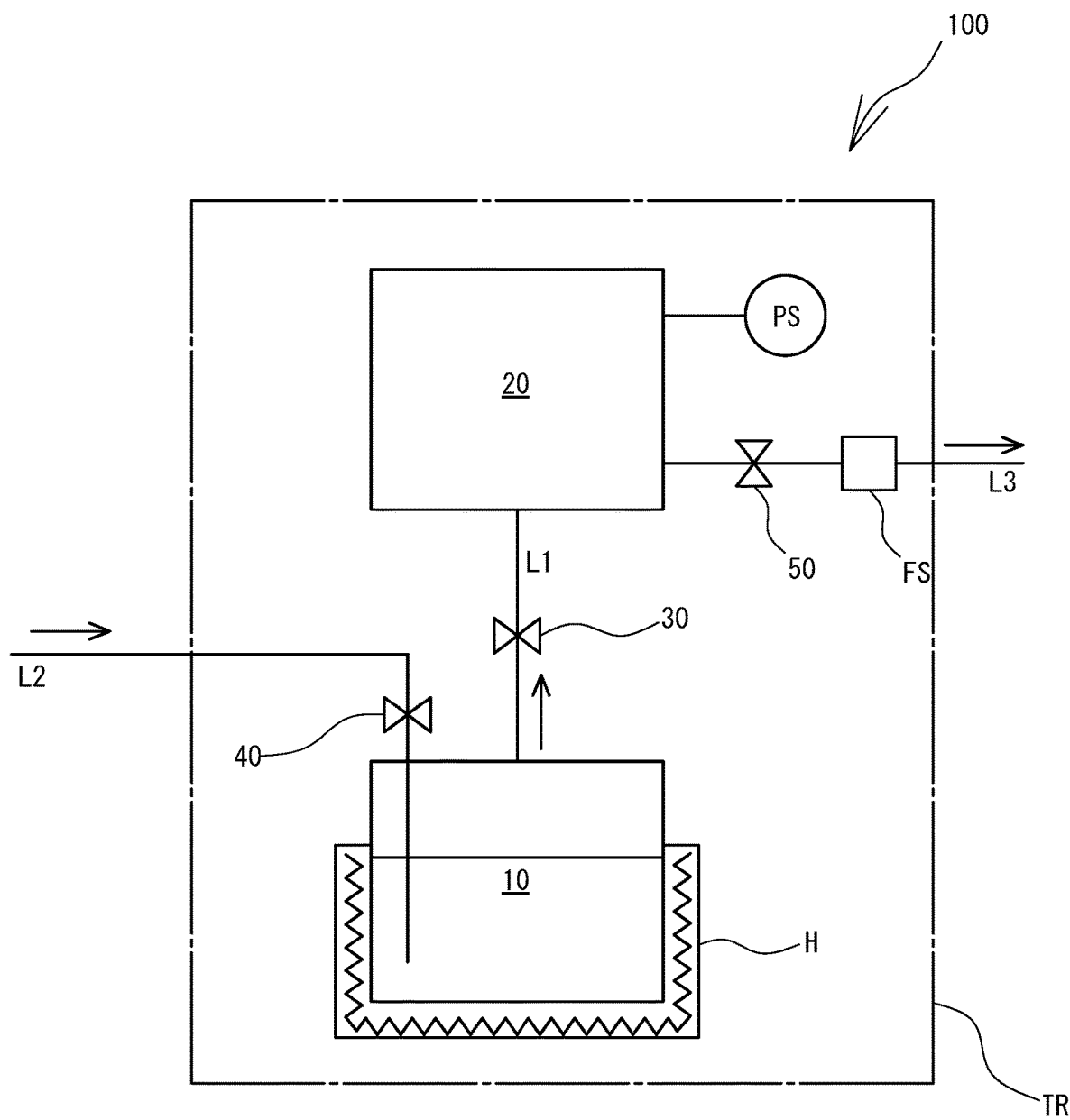
FIG. 2 is a schematic diagram illustrating a liquid material vaporization and supply device in a second embodiment.

A liquid material and vaporization supply device of the present embodiment is a variation of the above-described first embodiment, and as illustrated in FIG. 2, a flow rate sensor FS is installed on the downstream side of the fluid control valve 50 in the lead-out path L3 in the above-described first embodiment. Also, a flow rate control part in the present embodiment includes: a valve control part that controls the opening level of the fluid control valve 50 so that a sensed flow rate sensed by the flow rate sensor FS comes close to a preset set flow rate; a flow rate calculation part that, on the basis of the reduction amount of the sensed pressure sensed by the pressure sensor PS per unit time, calculates the flow rate of the material gas led out of the second tank 20 within the unit time; and a set flow rate correction part that, on the basis of the deviation between the calculated flow rate calculated in the flow rate calculation part and the set flow rate, corrects the set flow rate. In addition, the other configurations are the same as in the above-described first embodiment.

Next, the operation of supplying the material gas from the second tank 20 to the supply destination in the present embodiment will be described.

First, when a supply instruction signal is inputted from the input means to the flow rate control part, the flow rate control part opens the fluid control valve 50 to a preset initial opening level. This allows the material gas to start flowing out from the second tank 20 to the lead-out path L3. Then, the valve control part starts feedback control that controls the opening level of the fluid control valve 50 so that the sensed flow rate $Q_m$ sensed by the flow rate sensor FS comes close to the preset set flow rate $Q_S$. Also, the flow rate calculation part senses the pressure inside the second tank 20 by the pressure sensor PS to calculate a pressure reduction amount $\Delta Pt$ per unit time $\Delta t$, and substitutes it into Expression (3) above to calculate the calculated flow rate $Q_C$ of the material gas led out of the second tank 20 within the unit time $\Delta t$. Then, the set flow rate correction part corrects the set flow rate $Q_S$ on the basis of the calculated flow rate $Q_C$ calculated in the flow rate calculation part and the set flow rate $Q_S$. Further, while the set flow rate correction part is correcting the set flow rate $Q_S$ every unit time $\Delta t$, the valve control part repeats the feedback control, and thereby the material gas from the second tank 20 is controlled at a flow rate near the set flow rate $Q_S$.

In addition, in the present embodiment, by providing limits to the variation width of the set flow rate $Q_S$ corrected by the set flow rate correction part, hypersensitive flow rate change when the noise or variation of the sensed pressure sensed by the pressure sensor is large can be suppressed.

Third Embodiment

A liquid material vaporization and supply device of the present embodiment is a variation of the above-described first embodiment, and has the same configuration as the above-described first embodiment except for a difference in the configuration of the flow rate control part. The flow rate control part in the present embodiment includes: a flow rate calculation part that, on the basis of the pressure reduction amount between sensed pressure sensed by the pressure sensor PS at a predetermined timing and sensed pressure sensed after a predetermined time has elapsed since the predetermined timing, calculates the flow rate of the material gas led out of the second tank 20 within the predetermined time; an assumed flow rate calculation part that assumes the case where the material gas is led out of the second tank 20 in accordance with a preset set flow rate, and under this assumption, calculates the flow rate of the material gas led out within the predetermined time; and a valve control part that, on the basis of the deviation between the calculated flow rate calculated in the flow rate calculation part and the assumed flow rate calculated in the assumed flow rate calculation part, controls the opening level of the fluid control valve.

Next, the operation of supplying the material gas from the second tank 20 to the supply destination in the present embodiment will be described.

First, when a supply instruction signal is inputted from the input means to the flow rate control part, the flow rate control part opens the fluid control valve 50 to a preset initial opening level. This allows the material gas to start flowing out from the second tank 20 to the lead-out path L3. Then, the flow rate calculation part senses the sensed pressure $P_m$ sensed at the predetermined timing by the pressure sensor PS and the sensed pressure $P_m'$ sensed after the predetermined time $\Delta t'$ has elapsed since the predetermined timing to calculate the pressure reduction amount $\Delta Pt'$ within the predetermined time $\Delta t'$, and substitutes it into Expression (3) above to calculate the calculated flow rate $Q_C$ of the material gas led out of the second tank 20 within the predetermined time $\Delta t'$. Also, the assumed flow rate calculation part assumes the case where the material gas is led out of the second tank 20 in accordance with the preset set flow rate $Q_S$, and under this assumption, calculates the assumed flow rate $Q_A$ of the material gas led out within the predetermined time $\Delta t'$. Subsequently, on the basis of the deviation between the calculated flow rate $Q_C$ calculated in the flow rate calculation part and the assumed flow rate $Q_A$ calculated in the assumed flow rate calculation part, the valve control part controls the opening level of the fluid control valve 50 so that the calculated flow rate $Q_C$ comes close to the assumed flow rate $Q_A$. Then, the flow rate calculation part and the assumed flow rate calculation part repeat the calculations every elapsed time since the predetermined timing, and on the basis of the resulting calculation results, the valve control part repeats controlling the opening level of the fluid control valve 50, whereby the material gas from the second tank 20 is controlled at a flow rate near the set flow rate $Q_S$.

In such a configuration, even if a large error occurs in the sensed pressure sensed by the pressure senor when the elapsed time since the predetermined timing is short, after that, as the elapsed time becomes longer, the error decreases, and the influence of the error is significantly suppressed in total.

In addition, in the present embodiment, the calculated flow rate $Q_C$ may be calculated as follows. That is, first, on the basis of the reduction amount of the sensed pressure per unit time $\Delta t$ sensed by the pressure sensor PS every unit time $\Delta t$, the flow rate of the material gas led out of the second tank within each unit time $\Delta t$ is calculated. Subsequently, an integrated value obtained by integrating the calculated flow rate within each of unit times Δt included within a predetermined time ΔT since the predetermined timing is divided by the number of the unit times. In doing so, the calculated flow rate $Q_C$ of the material gas led out of the second tank within the predetermined time ΔT is calculated.

Fourth Embodiment

A liquid material vaporization and supply device of the present embodiment is a variation of the above-described first embodiment, and has the same configuration as the above-described first embodiment except for a difference in the configuration of the flow rate control part. The flow rate control part in the present embodiment includes: an assumed pressure calculation part that assumes the case where the material gas is led out of the second tank 20 in accordance with a preset set flow rate, and under this assumption, calculates the assumed pressure inside the second tank 20 after a predetermined time has elapsed since the material gas started to be led out; and a valve control part that, on the basis of the deviation between sensed pressure sensed by the pressure sensor PS after the predetermined time has elapsed since the material gas started to be led out of the second tank 20 and the assumed pressure, controls the opening level of the fluid control valve 50 so that the sensed pressure comes close to the assumed pressure.

Next, the operation of supplying the material gas from the second tank 20 to the supply destination in the present embodiment will be described.

First, when a supply instruction signal is inputted from the input means to the flow rate control part, the flow rate control part opens the fluid control valve 50 to a preset initial opening level. This allows the material gas to start flowing out from the second tank 20 to the lead-out path L3. Then, the assumed pressure calculation part assumes the case where the material gas is led out of the second tank 20 in accordance with the preset set flow rate $Q_S$, and under this assumption, calculates the assumed pressure $P_A$ inside the second tank 20 after the predetermined time ΔT has elapsed since the material gas started to be led out. In addition, in this case, the assumed pressure $P_A$ necessary for the flow rate of the material gas led out of the second tank 20 to reach the set flow rate $Q_S$ is preliminarily calculated back by Expression (3) above. That is, since the set flow rate $Q_S$ and the predetermined time ΔT are known, a pressure reduction amount ΔPt per predetermined time ΔT can be calculated by Expression (3) above, and from the pressure reduction amount ΔPt and the predetermined time ΔT, the assumed pressure $P_A$ is calculated. Then, on the basis of the deviation between sensed pressure $P_m$ sensed by the pressure sensor PS after the predetermined time ΔT has elapsed since the material gas started to be led out of the second tank 20 and the assumed pressure $P_A$, the valve control part controls the opening level of the fluid control valve 50 so that the sensed pressure $P_m$ comes close to the assumed pressure $P_A$. Further, the assumed pressure calculation part repeats the calculation every elapsed time since the material gas started to be led out of the second tank 20, and on the basis of the resulting calculation result, the valve control part repeats controlling the opening level of the fluid control valve 50, whereby the material gas from the second tank 20 is controlled at a flow rate near the set flow rate $Q_S$.

Fifth Embodiment

Figure 3:
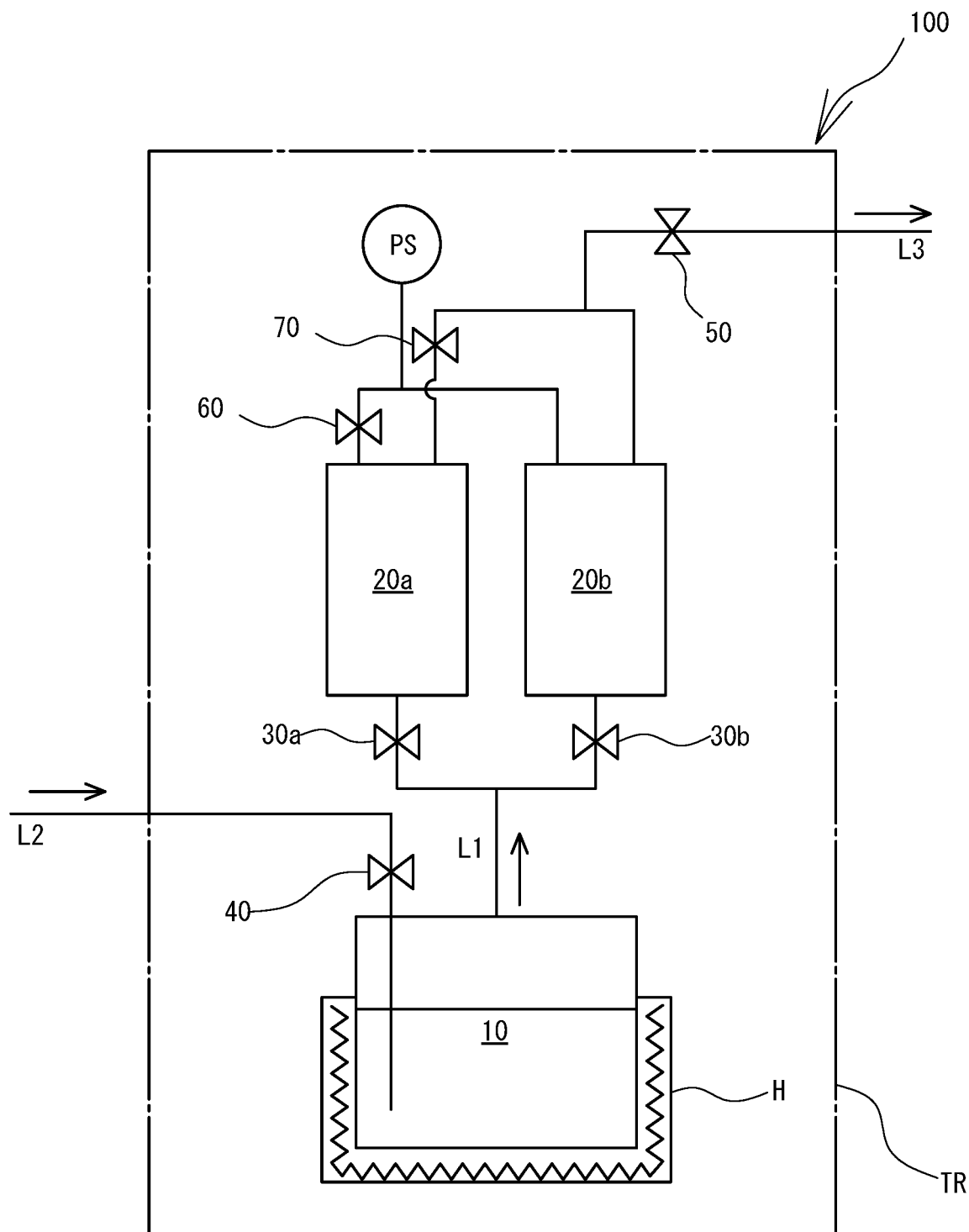
FIG. 3 is a schematic diagram illustrating a liquid material vaporization and supply device in a fifth embodiment.

A liquid material vaporization and supply device of the present embodiment is a variation of the above-described first embodiment, in which as illustrated in FIG. 3, two second tanks 20a, 20b are connected to the first tank 10 in the above-described first embodiment and the control device is provided with an introduction tank number adjustment part (not illustrated) that, on the basis of a set flow rate, adjusts the number of the second tanks 20a, 20b to which the material gas is to be introduced from the first tank 10. In addition, the two second tanks 20a, 20b have the same volume. Further, the downstream side of the connection path L1 extending from the first tank 10 is branched to be connected to the respective second tanks 20a, 20b, and on the downstream sides with respect to the branching point of the connection path L1, first on-off valves 30a, 30b are respectively installed. Also, the fore end side of a connection pipe extending from the pressure sensor PS is branched to be connected to the respective second tanks 20a, 20b, and on the fore end side of the connection pipe, which is connected to one second tank 20a, a third on-off valve 60 is installed. Still further, the downstream sides of lead-out paths L3 extending from the respective second tanks 20a, 20b are merged, and on the upstream side with respect to the merging point of the lead out path L3 extending from the one second tank 20a, a fourth on-off valve 70 is installed, whereas on the downstream side with respect to the merging point of the lead-out path L3, the fluid control valve 50 is installed.

In addition, when the set flow rate is large, the introduction tank number adjustment part opens the third on-off valve 60 and the fourth on-off valve 70 from a state where the material gas is contained in both the second tanks 20a, 20b, and leads out the material gas in both the second tanks 20a, 20b. In doing so, the total amount of the material gas supplied to the supply destination can be increased. On the other hand, when the set flow rate is small, from the state where the material gas is contained in both the second tanks 20a, 20b, the third on-off valve 60 and the fourth on-off valve 70 are closed to lead out the material gas only in the other second tank 20b. In doing so, the pressure reduction amount of sensed pressure sensed by the pressure sensor PS per unit time is increased, and an error due to the pressure sensor PS can be suppressed. Also, the introduction tank number adjustment part performs control to alternately lead out the material gas in the respective second tank 20a, 20b, and thereby the material gas can be continuously supplied to the supply destination. Specifically, while the material gas contained in the one second tank 20a is being led out, the material gas is contained in the other second tank 20b, and while the material gas contained in the other second tank 20b is being led out, the material gas is contained in the one second tank 20a. In addition, by repeating this operation, the material gas can be continuously supplied to the supply destination. Note that in the present embodiment, the two second tanks are installed; however, three or more may be installed, and the volumes of respective tanks are not required to be the same.

Other Embodiments

As another embodiment, in the above-described first and second embodiments, the flow rate control part may be provided with a unit time changing part that, on the basis of the set flow rate, changes the interval of the unit time, and changes the unit time to be longer as the set flow rate is made smaller.

Generally, when the set flow rate is small, a pressure reduction amount per unit time is small, and along with this, a sensing error by the pressure sensor PS is large. For this reason, by adopting the above-described configuration, the interval of the unit time is changed depending on the set flow rate, and when the set flow rate is small, the interval of the unit time is increased to increase the pressure reduction amount per unit time, thereby making it possible to suppress the influence of the sensing error by the pressure sensor PS.

In addition, as another embodiment, in each of the above-described embodiments, a temperature sensor TS for sensing the temperature inside the second tank PS may be installed, and the flow rate control part may be provided with a sensed pressure correction part that, on the basis of the sensed temperature sensed by the temperature sensor TS, corrects the sensed pressure sensed by the pressure sensor PS.

When the material gas is led out of the second tank 20 to reduce the pressure inside the second tank 20, along with this, adiabatic expansion occurs to reduce the temperature inside the second tank 20. This causes an error in pressure sensing by the pressure sensor PS. For this reason, by above-described configuration to sense the temperature inside the second tank 20 by the temperature sensor TS and on the basis of the sensed temperature, correcting the sensed pressure sensed by the pressure sensor PS, the error is suppressed.

Specifically, it is only necessary that when sensing the sensed pressure by the pressure sensor PS, the temperature is sensed by the temperature sensor TS, and on the basis of the sensed temperature, the sensed pressure is corrected. Also, it is only necessary that when introducing the material gas from the first tank 10 to the second tank 20, a temperature rise amount during a period from the start of the introduction to when the temperature inside the second tank 20 is stabilized after the end of the introduction is preliminarily measured by the temperature sensor TS, and on the basis of the temperature rise amount, the sensed pressure sensed by the pressure sensor PS is corrected when leading the material gas out of the second tank 20.

In addition, the reduction in the temperature along with the reduction in the pressure inside the second tank 20 can also be suppressed by expanding a thermal conductive area of the second tank 20.

As another embodiment, each of the above-described embodiments may be adapted to, in place of the first on-off valve 30 installed in the connection path L1, install a pump for forcibly supplying the material gas from the first tank 10 to the second tank 20 and make the pressure control part control driving/stopping of the pump to introduce the material gas from the first tank 10 to the second tank 20. In this case, it is only necessary that, in the operation of introducing the material gas from the first tank 10 to the second tank 20, the pressure inside the second tank 20 is monitored by the pressure sensor PS, and when the pressure inside the second tank 20 reaches a predetermined pressure, the pressure control part stops driving of the pump. Note that a mechanism including the pump and the pressure control part in the present embodiment corresponds to a pressure control mechanism in claims.

In such a configuration, even without heating the liquid material at high temperature to raise vapor pressure, the pressure of the material gas contained in the second tank 20 can be ensured, and this eliminates the need to expose the liquid material to high temperature for a long time, and makes it possible to reduce a risk such as alteration/decomposition of the liquid material. Also, since the pressure of the material gas is set for the second tank 20 on the basis of not the differential pressure between the first tank 10 and the second tank 30 but the sensed pressure by the pressure sensor PS, the pressure inside the second tank 20 can be intentionally reduced, and this makes it possible to suppress a sensing error by the pressure sensor PS. In addition, as in the above-described first embodiment, also in the case of introducing the material gas to the second tank 20 using the differential pressure between the first tank 10 and the second tank 20, the pressure inside the second tank 20 can also be set on the basis of the sensed pressure by the pressure sensor PS with the first on-off valve 30 closed, and the pressure inside the second tank 20 can be intentionally made lower than vapor pressure.

INDUSTRIAL APPLICABILITY

According to the present invention, the need to perform calibration corresponding to the type of material gas is eliminated, and even in the case of material gas on which calibration data is not available, a flow rate can be accurately controlled.

The invention claimed is:
1. A liquid material vaporization and supply device comprising:
    a first tank in which a liquid material is vaporized to produce material gas;
    a second tank that is connected to the first tank and in which the material gas produced in the first tank is contained at a predetermined pressure;
    a pressure sensor that senses pressure inside the second tank;
    a lead-out path for leading the material gas out of the second tank;
    a fluid control valve that is provided in the lead-out path to open/close the lead-out path; and
    a flow rate control part that, when the material gas contained in the second tank at the predetermined pressure is led out through the lead-out path, on a basis of a reduction in the sensed pressure sensed by the pressure sensor, controls an opening level of the fluid control valve to control a flow rate of the material gas led out through the lead-out path.

2. The liquid material vaporization and supply device according to claim 1, wherein
    the flow rate control part comprises:
    a flow rate calculation part that, on a basis of a reduction amount of the sensed pressure sensed by the pressure sensor per unit time, calculates a flow rate of the material gas led out of the second tank within the unit time; and
    a valve control part that, on a basis of a deviation between the calculated flow rate calculated in the flow rate calculation part and a preset set flow rate, controls the opening level of the fluid control valve.

3. The liquid material vaporization and supply device according to claim 2, wherein
    the flow rate control part further comprises a unit time changing part that, on a basis of the set flow rate, changes the unit time, and changes the unit time to be longer as the set flow rate is made smaller.

4. The liquid material vaporization and supply device according to claim 2, wherein
    multiple second tanks are connected to the first tank,
    the liquid material vaporization and supply device further comprising
    an introduction tank number adjustment part that, on a basis of the set flow rate, adjusts the number of the second tanks to which the material gas is to be introduced.

5. The liquid material vaporization and supply device according to claim 1, further comprising
- a flow rate sensor that senses the flow rate of the material gas led out through the lead-out path, wherein
- the flow rate control part comprises:
- a valve control part that, on a basis of a deviation between the sensed flow rate sensed by the flow rate sensor and a preset set flow rate, controls the opening level of the fluid control valve;
- a flow rate calculation part that, on a basis of a reduction amount of the sensed pressure sensed by the pressure sensor per unit time, calculates a flow rate of the material gas led out of the second tank within the unit time; and
- a set flow rate correction part that, on a basis of a deviation between the calculated flow rate calculated in the flow rate calculation part and the set flow rate, corrects the set flow rate.

6. The liquid material vaporization and supply device according to claim 1, wherein
- the flow rate control part comprises:
- a flow rate calculation part that, on a basis of a reduction amount between sensed pressure sensed by the pressure sensor at a predetermined timing and sensed pressure sensed after a predetermined time has elapsed since the predetermined timing, calculates a flow rate of the material gas led out of the second tank within the predetermined time;
- an assumed flow rate calculation part that assumes a case where the material gas is led out of the second tank in accordance with a preset set flow rate, and under this assumption, calculates a flow rate of the material gas led out within the predetermined time; and
- a valve control part that, on a basis of a deviation between the calculated flow rate calculated in the flow rate calculation part and an assumed flow rate calculated in the assumed flow rate calculation part, controls the opening level of the fluid control valve.

7. The liquid material vaporization and supply device according to claim 6, wherein
- on a basis of a reduction amount of sensed pressure sensed per unit time by the pressure sensor every unit time since the predetermined timing, the flow rate calculation part calculates a flow rate of the material gas led out of the second tank within each unit time, and on the basis of each resulting calculated flow rate, calculates the flow rate of the material gas led out of the second tank within the predetermined time.

8. The liquid material vaporization and supply device according to claim 1, wherein
- the flow rate control part comprises:
- an assumed pressure calculation part that assumes a case where the material gas is led out of the second tank in accordance with a preset set flow rate, and under this assumption, calculates assumed pressure inside the second tank after a predetermined time has elapsed since the material gas started to be led out; and
- a valve control part that, on a basis of a deviation between sensed pressure sensed by the pressure sensor after the predetermined time has elapsed since the material gas started to be led out of the second tank and the assumed pressure calculated in the assumed pressure calculation part, controls the opening level of the fluid control valve.

9. The liquid material vaporization and supply device according to claim 1, further comprising
- a temperature sensor that senses temperature inside the second tank, wherein
- the flow rate control part further comprises
- a sensed pressure correction part that, on a basis of the sensed temperature sensed by the temperature sensor, corrects the sensed pressure sensed by the pressure sensor.

10. The liquid material vaporization and supply device according to claim 1, further comprising
- a pressure control mechanism that controls the material gas introduced from the first tank to the second tank to a predetermined pressure.

11. The liquid material vaporization and supply device according to claim 10, wherein
- the pressure control mechanism comprises:
- an on-off valve that adjusts a flow rate of the material gas introduced from the first tank to the second tank; and
- a pressure control part that opens/closes the on-off valve, and on a basis of a differential pressure between the first tank and the second tank, controls pressure of the material gas introduced to the second tank.

12. The liquid material vaporization and supply device according to claim 11, wherein
- the pressure control part adjusts temperature of a heater for heating the first tank, and controls the differential pressure between the first tank and the second tank.

13. The liquid material vaporization and supply device according to claim 11, wherein
- the pressure control part stops introducing the material gas to the second tank when the sensed pressure sensed by the pressure sensor reaches a predetermined pressure.

14. The liquid material vaporization and supply device according to claim 10, wherein
- the pressure control mechanism comprises:
- a pump that forcibly introduces the material gas from the first tank to the second tank; and
- a pressure control part that stops driving of the pump, and controls pressure of the material gas introduced to the second tank.

15. A computer-readable storage medium configured to store a control program for a liquid material vaporization and supply device comprising: a pressure sensor that senses pressure inside a second tank in which material gas is contained at a predetermined pressure from a first tank in which a liquid material is vaporized to produce the material gas; and a fluid control valve that opens and closes a lead-out path for leading the material gas out of the second tank, the control program being executable to:
- when the material gas contained in the second tank at the predetermined pressure is led out through the lead-out path, on a basis of a reduction in the sensed pressure sensed by the pressure sensor, control an opening level of the fluid control valve to control a flow rate of the material gas led out through the lead-out path.

* * * * *